US010712360B2

(12) United States Patent
Van Der Merwe

(10) Patent No.: US 10,712,360 B2
(45) Date of Patent: Jul. 14, 2020

(54) DIFFERENTIAL CHARGE TRANSFER BASED ACCELEROMETER

(71) Applicant: AZOTEQ (PTY) LTD, Paarl (ZA)

(72) Inventor: Douw Gerbrandt Van Der Merwe, Paarl (ZA)

(73) Assignee: AZOTEQ (PTY) LTD, Paarl (ZA)

( * ) Notice: Subject to any disclaimer, the term of this patent is extended or adjusted under 35 U.S.C. 154(b) by 118 days.

(21) Appl. No.: 16/142,349

(22) Filed: Sep. 26, 2018

(65) Prior Publication Data

US 2019/0094261 A1   Mar. 28, 2019

(30) Foreign Application Priority Data

Sep. 27, 2017   (ZA) .................................. 2017/06491

(51) Int. Cl.
*G01P 15/18* (2013.01)
*G01P 15/125* (2006.01)
(Continued)

(52) U.S. Cl.
CPC ............ *G01P 15/125* (2013.01); *G01P 15/18* (2013.01); *G01R 27/2605* (2013.01); *G01P 21/00* (2013.01)

(58) Field of Classification Search
CPC ... G01R 27/2605; G01P 15/125; G01P 21/00; G01P 15/18; G01P 15/131; G01D 5/2417; G01L 9/12; G01L 1/144
See application file for complete search history.

(56) References Cited

U.S. PATENT DOCUMENTS 2,869,851 A    1/1959   Sedgfield et al.
3,545,283 A   12/1970   McGunigle
(Continued)

FOREIGN PATENT DOCUMENTS

WO     2015/131209 A2    9/2015

OTHER PUBLICATIONS

Yazdi, N. et al., "An All-Silicon Single-Wafer Micro-g Accelerometer with a Combined Surface and Bulk Micromachining Process", Journal of Microelectromechanical Systems, Dec. 2000, pp. 544-550-, vol. 9, No. 4.
(Continued)

*Primary Examiner* — Brandi N Hopkins
(74) *Attorney, Agent, or Firm* — Mattingly & Malur, PC

(57) ABSTRACT

An integrated circuit measures a differential change between first and second mutual capacitances having receiver electrodes joined to form a common electrode of an MEMS circuit. The integrated circuit performs charge transfer measurements to transfer charge to a reference capacitor and a variable capacitor is used to change the amount of charge stored in the reference capacitor. First and second charge transfer measurements are performed, each having a number of charge transfer cycles used to transfer charge from the common electrode to the reference capacitor. In the first measurement, a transmit electrode of the first capacitance is driven high first, and in the second measurement, a transmit electrode of the second capacitance is driven high first. The circuit compensates for parasitic capacitances in the MEMS circuit with a sample-and-hold circuit selectively connected to the common electrode to maintain its voltage during a charge phase of a charge transfer cycle.

20 Claims, 3 Drawing Sheets

(51) Int. Cl.
*G01R 27/26* (2006.01)
*G01P 21/00* (2006.01)

(56) References Cited

U.S. PATENT DOCUMENTS

| | | | |
|---|---|---|---|
| 4,483,194 A | 11/1984 | Rudolf | |
| 4,736,629 A | 4/1988 | Cole | |
| 5,006,952 A | 4/1991 | Thomas | |
| 5,025,346 A | 6/1991 | Tang et al. | |
| 5,095,762 A | 3/1992 | Holm-Kennedy et al. | |
| 5,345,824 A | 9/1994 | Sherman et al. | |
| 5,349,858 A | 9/1994 | Yagi et al. | |
| 5,417,312 A | 5/1995 | Tsuchitani et al. | |
| 5,487,305 A | 1/1996 | Ristic et al. | |
| 5,540,095 A | 7/1996 | Sherman et al. | |
| 5,627,316 A | 5/1997 | De Winter et al. | |
| 5,659,195 A | 8/1997 | Kaiser et al. | |
| 5,786,997 A | 7/1998 | Hoyt et al. | |
| 5,821,421 A | 10/1998 | Reverend | |
| 5,831,164 A | 11/1998 | Reddi et al. | |
| 5,892,154 A | 4/1999 | Negoro | |
| 5,900,550 A | 5/1999 | Menzel | |
| 5,905,203 A | 5/1999 | Flach et al. | |
| 5,974,880 A | 11/1999 | Yamaguchi et al. | |
| 5,977,803 A | 11/1999 | Tsugai | |
| 6,000,287 A | 12/1999 | Menzel | |
| 6,035,694 A | 3/2000 | Dupuie et al. | |
| 6,082,197 A | 7/2000 | Mizuno et al. | |
| 6,199,874 B1 | 3/2001 | Galvin et al. | |
| 6,392,527 B1 | 5/2002 | Gilano et al. | |
| 6,492,911 B1 | 12/2002 | Netzer | |
| 6,505,515 B1 | 1/2003 | Delaporte | |
| 6,626,040 B1 | 9/2003 | Perreira | |
| 7,059,189 B2 | 6/2006 | Drabe et al. | |
| 7,263,896 B2 | 9/2007 | Bonin | |
| 7,287,429 B2 | 10/2007 | Umemura | |
| 7,343,801 B2 | 3/2008 | Kapser et al. | |
| 7,353,711 B2 | 4/2008 | O'Dowd et al. | |
| 7,398,683 B2 | 7/2008 | Lehtonen | |
| 7,521,941 B2 | 4/2009 | Ely et al. | |
| 7,532,016 B2 | 5/2009 | Grosjean et al. | |
| 7,652,486 B2 | 1/2010 | Shikata | |
| 7,716,983 B2 | 5/2010 | Lehtonen | |
| 7,724,000 B2 | 5/2010 | Grosjean et al. | |
| 8,395,395 B2 | 3/2013 | Bruwer et al. | |
| 8,429,981 B2 | 4/2013 | Grosjean et al. | |
| 8,629,684 B2 | 1/2014 | Deschildre et al. | |
| 8,659,306 B2 | 2/2014 | Bruwer et al. | |
| 9,110,113 B2 | 8/2015 | Grosjean et al. | |
| 10,564,176 B2* | 2/2020 | Grosjean | G01P 15/13 |
| 2003/0098699 A1* | 5/2003 | Lemkin | G01R 27/2605 324/678 |
| 2009/0108914 A1* | 4/2009 | Zhang | H03K 17/962 327/517 |

OTHER PUBLICATIONS

Butefisch, S. et al., "Three-Axes Monolithic Silicon Low-g Accelerometer", Journal of Microelectromechanical Systems, Dec. 2000, pp. 551-556, vol. 9, No. 4.

* cited by examiner

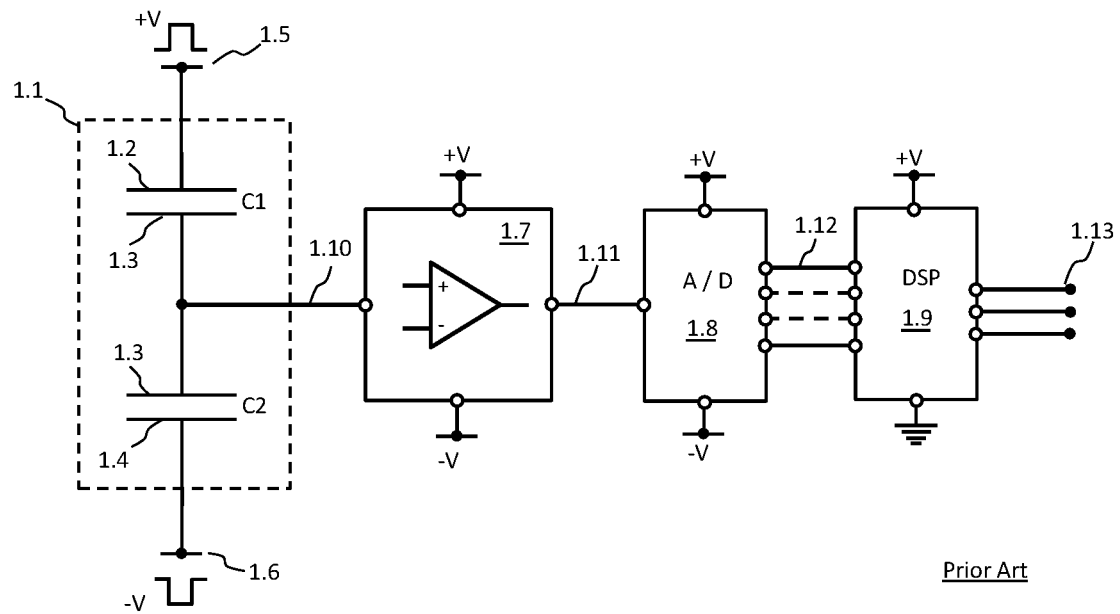
FIG. 1 – Prior Art
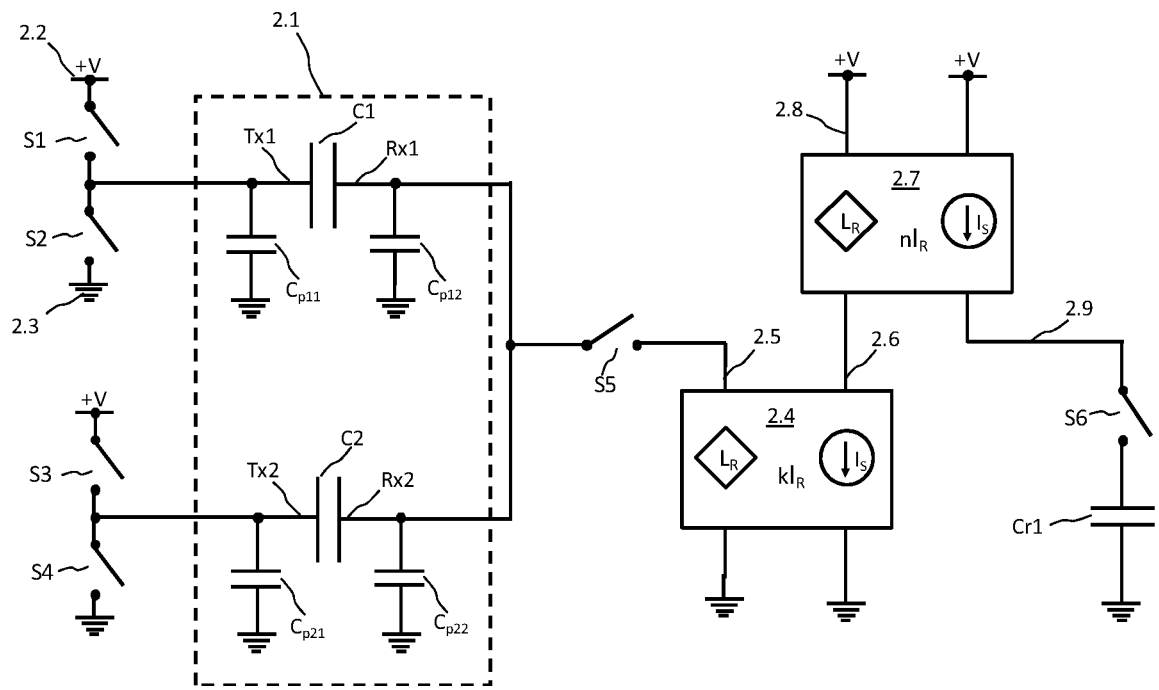
FIG. 2

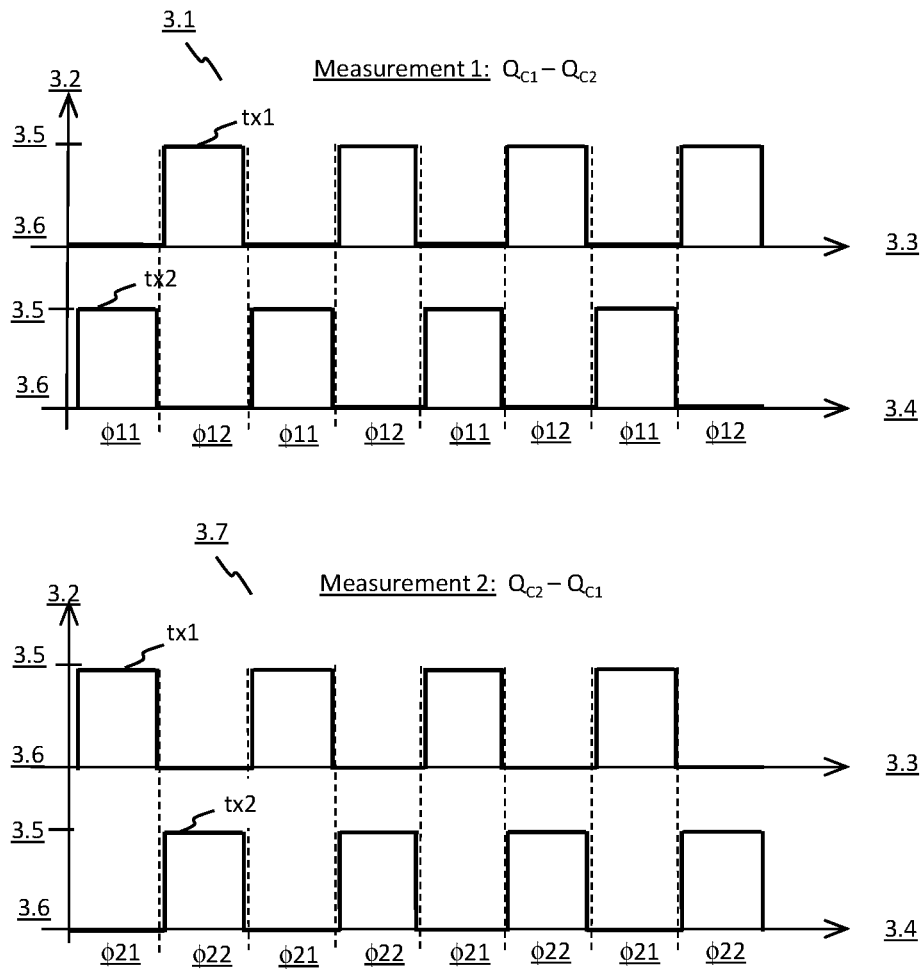

FIG. 3

| | Case 1<br>C1 > C2 | Case 2<br>C1 < C2 | Case 3<br>C1 = C2 |
|---|---|---|---|
| Measurement 1:<br>$Q_{C1} - Q_{C2}$ | Ct1= Qr/ΔQ1<br>ΔQ1 transferred<br>during each CT cycle | No transfer<br>ΔQ = 0<br>Ct2 = Ctmax | No transfer<br>ΔQ = 0<br>Ct3 = Ctmax |
| Measurement 2:<br>$Q_{C2} - Q_{C1}$ | No transfer<br>ΔQ = 0<br>Ct1 = Ctmax | Ct2 = Qr/ΔQ2<br>ΔQ2 transferred<br>during each CT cycle | No transfer<br>ΔQ = 0<br>Ct3 = Ctmax |
| Result after measurements: | Use Ct1 from Meas. 1<br>Ct1 proportional to amount by which C1 is larger than C2 | Use Ct2 from Meas. 2<br>Ct2 proportional to amount by which C2 is larger than C1 | C1 = C2<br>Since<br>Ct3 = Ctmax<br>for both measurements |

FIG. 4

DIFFERENTIAL CHARGE TRANSFER BASED ACCELEROMETER

CROSS-REFERENCE TO RELATED APPLICATION

The present application claims priority from South Africa application ZA 2017/06491, filed on Sep. 27, 2017, contents of which is hereby incorporated by reference into this application.

BACKGROUND OF THE INVENTION

Integrated accelerometers which utilize capacitive structures are well known in the art, and are becoming more prevalent in consumer electronics such as smart phones, tablets and so forth. Such accelerometers typically comprise Micro Electromechanical Systems (MEMS) technology, wherein comb-like structures have sets of conductive fingers which are spaced apart and interleaved, with one set of fingers typically movable relative to the other. During acceleration or deceleration, the conductive fingers of said structures move closer or further from each other, with an associated change in measured voltages. From the change in measured voltage, signal processing circuitry, typically within the integrated accelerometer, calculates the acceleration force applied. In typical prior art accelerometers, a comb-like structure is utilized for each orthogonal direction in a three dimensional coordinate system. The capacitive comb is just one possible MEMS implementation used by the prior art, with many alternatives known for using MEMS to obtain capacitive readout due the displacement of a proof mass. For example, it is known that a z-axis accelerometer may be realized by using the parallel plate capacitance between two plates which move relative to one another.

FIG. 1 illustrates circuitry for some prior art accelerometers in a block diagram schematic. Block 1.1 represent the comb-like structures, with C1 the capacitance between a set of fingers 1.2 and a movable set 1.3, and C2 the capacitance between another set of fingers 1.4 and the movable set of fingers 1.3. When the accelerometer moves, C1 and C2 changes accordingly, with C1 which typically increases and C2 which decreases for movement along one axis, and vice versa. The series string of C1 and C2 is typically connected between a pulsed positive supply rail 1.5 and a correspondingly pulsed negative rail 1.6, with the voltage at the centre of the series string fed via an interconnection 1.10 to a differential amplifier block 1.7, also powered from a positive and a negative rail. The voltage at 1.10 represents the delta or change in capacitances C1 and C2. If no movement occurs, and C1 and C2 do not change from their calibrated values, the voltage on 1.10 stays at zero. Any change in C1 and C2 should result in a voltage above or below zero. For instance, if C2 decreases, and C1 increases accordingly, more voltage will fall over C2, resulting in a voltage above zero at 1.10. Conversely, for an increase in C2, the voltage at 1.10 should change to below zero.

Amplifier block 1.7 feeds an amplified value of the voltage at 1.10 to an analog-to-digital (A/D) block 1.8 via interconnect 1.11, with block 1.8 also supplied from positive and negative rails. A digital value of the voltage at 1.11 is communicated by the A/D via a serial or parallel connection 1.12 to a digital signal processor (DSP) 1.9, which provides an indication of calculated acceleration, or values proportional to it, at 1.13. Typically, DSP 1.9 may be supplied with a single positive rail and ground.

One of the drawbacks of some prior art accelerometers is the requirement for both a positive and negative supply rail, as this requires additional circuitry and semiconductor real estate. Another drawback is the complexity of the circuitry, with an amplification stage, a digital conversion stage and a signal processing stage, wherein these stages typically conserve a fair amount of power. In addition, the prior art does not make direct use of the underlying mechanism present in said comb-like structures. When said conductive fingers move relative to one another, the capacitance of the structures and the relative amounts of stored charge changes. It may be advantageous to directly measure the differential change in stored charge and capacitance with a charge transfer technique which have low relative power consumption.

Another challenge with prior art MEMS solutions is the parasitic capacitances realized with practical MEMS structures, which may be on the order of one to a few pico Farad (pF), (1 pF=$10^{-12}$ F). These parasitic capacitances may negatively influence the resolution and range of capacitance measurements made during acceleration detection. Prior art capacitive MEMS solutions also suffer from a large offset in the capacitance signal being measured. During production of such MEMS structures, utmost care needs to be taken to ensure that the structures are completely symmetrical, i.e. that C1 and C2 have the same value. However, in reality, due to manufacturing tolerances, C1 and C2 often differ by a value on the order of 100 femto Farad (fF), (1 fF=$10^{-15}$ F), where C1 and C2 themselves have values in the range of 1 pF to 1.5 pF. Given that the typical change in capacitance due to acceleration which has to be measured is a few atto Farad (aF), (1 aF=$10^{-18}$ F), such a large offset makes the measurement, often performed with an op-amp circuit, very challenging, adding complexity and cost to prior art solutions.

In addition, the two integrated circuits (IC's) respectively containing the MEMS structure and the Application Specific Integrated Circuit (ASIC) used for signal processing have to be developed in conjunction, to ensure a high level of matching and minimum offset in the differential capacitance signal. In prior art solutions, it is considered impractical to develop the MEMS structure integrated circuit in isolation, and to connect it to a signal processing ASIC not specifically tailored to it, due to said large offset in differential capacitances.

Given the above, prior art capacitive structure MEMS accelerometers may be improved by effective compensation for parasitic capacitances of the MEMS structure, as well as differential capacitance offset compensation with a large range, easing production and integrated circuit matching requirements.

SUMMARY OF THE INVENTION

Accordingly, the present invention teaches the use of charge-transfer (CT) circuitry and methods to directly measure the differential change in stored charge and capacitance of conductive structures due to acceleration experienced by said structures. More specifically, the present invention teaches that a CT circuit may be used to measure the difference between charge stored in a first and a second capacitance of a conductive structure or structures due to acceleration experienced by said structure or structures, wherein said first and second capacitances may be arranged in a back-to-back combination, with the two distal ends of said combination which may be alternately and in complimentary manner connected to a positive supply and to ground respectively. For example, when a first distal terminal of the first capacitance is connected to ground, a second distal terminal of said second capacitance may be connected to a positive supply rail, and vice versa. According to the present invention, the alternate and complimentary connection of the distal ends or terminals of said back-to-back combination of capacitances may be performed repetitively, and may form part of a CT process or method used by said CT circuit.

By practicing the teachings of the present invention, it may be possible to effectively and accurately compensate for parasitic capacitances present in said conductive structure or structures, or elsewhere. Further, the effect of any large offset in the CT signal entering said CT circuit may be effectively negated or removed by using current mirror structures and a highly accurate, digitally controlled capacitance to perform Parasitic Capacitance Cancellation (PCC).

Further, the present invention teaches that measurement of said differential change in charge stored in the capacitances, and thereby of the capacitances themselves, may be realized as follows. During a first phase of a first measurement, the distal, first terminal of said first capacitance may be connected to ground via a first controllable switch, and the distal, second terminal of said second capacitance may be connected to a positive supply rail via a second controllable switch. The second terminal of the first capacitance may be tied to the first terminal of the second capacitance to form a common terminal. A connection may be made via another controllable switch from said common terminal to an input of a current mirror circuit.

The current mirror circuit may be used to scale charge being transferred to a reference capacitor in a charge transfer measurement circuit, as disclosed in U.S. Pat. No. 8,659,306 to Bruwer et al, wherein said reference capacitor may be used to accumulate transferred charge up to a certain threshold level, or for a certain period, as is known in the art. Subsequently, during a second phase of the first measurement, said first terminal of the first capacitance may be connected to said positive supply rail via a third controllable switch and the second terminal of the second capacitance may be connected to ground via a fourth controllable switch, with said common terminal which may be connected via said another controllable switch to the input of the current mirror circuit. Said first and second phases of the first measurement may be alternately repeated until the voltage on said reference capacitor reaches a predetermined threshold, or for a predetermined period, with the number of charge transfers, or counts, which may be indicative of said differential change in capacitance and the amount of charge stored. A sample-and-hold circuit may be used to maintain the voltage at the input to said current mirror circuit at a constant level during repetitions of said first, or charge, phase of the first measurement, preferably, but not necessarily, at a value equal to the value at the input of said current mirror at the end of the second, or transfer, phase of the first measurement. This may be used to ensure that no netto charge, or a derivative thereof, due to parasitic capacitances present between said common terminal and ground is transferred to said reference capacitor.

During a first phase of a second measurement, according to the present invention, the first terminal of said first capacitance may be connected to the positive supply rail via the third controllable switch, and the second terminal of the second capacitance may be connected to ground via the fourth controllable switch, with said common terminal which may be connected to the input of said current mirror circuit via said another controllable switch. Subsequently, during a second phase of the second measurement, the first terminal of the first capacitance may be connected to ground via the first controllable switch, the second terminal of the second capacitance may be connected to the positive supply via said second controllable switch, and the common terminal may be connected to the input of the current mirror circuit via said another controllable switch. Said first and second phases of the second measurement may be alternately repeated until the voltage on said reference capacitor reaches a predetermined threshold, or for a predetermined period, with the number of charge transfers, or counts, which may be indicative of said differential change in capacitance. A sample-and-hold circuit may once again be used to maintain the voltage at the input to said current mirror circuit at a constant level during repetitions of said first, or charge, phase of the second measurement, preferably, but not necessarily, at the value present at the input of said current mirror at the end of the second, or transfer, phase of the second measurement. This may be used to ensure that no netto charge, or a derivative thereof, due to parasitic capacitances present between said common terminal and ground is transferred to said reference capacitor.

In the preceding disclosure, said first and second capacitances may be viewed as two mutual capacitances effectively connected in parallel and to the input of said current mirror and charge transfer measurement circuit. The amount of charge stored in each capacitance should therefore be directly dependent on its size. Further, the described and disclosed alternate connection of the terminals of said capacitances to the supply voltage and to ground may be seen as being equivalent to driving the transmitter terminals of said two mutual capacitances out of phase, with the result that the charge from one capacitance is subtracted from the charge of the other capacitance. Consequently, only the difference between the charge stored in the first capacitance and that stored in the second capacitance, or a charge delta, may be available for transfer to said charge transfer measurement circuit via the current mirror input. If the charge delta is positive, charge may enter the input diode of the charge transfer measurement circuit, and a charge proportional to it may be added to the reference capacitor of said circuit. If the charge delta is negative, current flow may be blocked by the input diode of the charge transfer measurement circuit, and no charge may be added to said reference capacitor.

According to the present invention, due to driving said first and second capacitances to be measured with out of phase transmitter electrode signals, performing a first measurement as disclosed may be seen as being equivalent to subtracting the charge stored in said second capacitance from that stored in said first capacitance. Correspondingly, performing a second measurement as disclosed may be seen as being equivalent to subtracting the charge stored in said first capacitance from that stored in said second capacitance.

The input of a current mirror circuit as disclosed in U.S. Pat. No. 8,659,306 exhibit diode like behaviour, wherein charge may be transferred into said circuit, but not out of it. Consequently, first and second measurements of the present invention as described above may be used as follows to determine both the amount of differential change between said first and second capacitances and which capacitance increased. For example, consider the case where said capacitances change so that the first capacitance is larger than the second. During said first measurement, subtracting the charge stored in the smaller, second capacitance from that stored in the larger, first capacitance should therefore result in a small surplus of charge, which may be transferred to said reference capacitor. The number of charge transfers needed to fill said reference capacitor up to a threshold during the first measurement may therefore be used as indication of the amount by which the first capacitance increased, or the acceleration experienced. Conversely, during said second measurement, subtracting the charge stored in the larger, first capacitance from that stored in the second, smaller capacitance should result in a small deficiency of charge. Due to said diode like behaviour of the current mirror input, charge may not be transferred out of the current mirror circuit to compensate for the charge deficiency. Consequently, the amount of charge stored in said reference capacitor will typically stay constant, and the second measurement may time out before the reference capacitor reaches it threshold voltage.

As another example, consider the opposite case where capacitances change, for example due to acceleration, so that the first capacitance is smaller than the second capacitance. In this case, when the charge stored in the second capacitance is subtracted from that stored in the first capacitance during said first measurement, a small charge deficiency may result for each charge transfer cycle, with the overall result for the first measurement being no change in the amount of charge stored in said reference capacitor, or a time-out result, as is known in the art. On the other hand, during the second measurement, subtraction of the amount of charge stored in the first capacitance from that stored in the larger, second capacitance may result in a small surplus of charge, which may be transferred to the reference capacitor. In this case, the number of charge transfers required to fill the reference capacitor up to a threshold during the second measurement may therefore be used as an indication of the amount by which the second capacitance increased, or the acceleration experienced.

Naturally, according to the present invention, in the case where said first and second capacitances stay constant, for example when no acceleration is experienced, both the first and second measurements should result in very little or no change in the amount of charge stored in the reference capacitor, and a time-out situation for the charge transfer measurement process. In other words, the measurement system may indicate that no acceleration was experienced, since both the first and second measurement delivered a no change, or time-out result.

Therefore, according to the present invention, the preceding disclosure may be used to measure acceleration experienced by a measurement system, as an exemplary application, using charge transfer measurements, a current mirror circuit and a reference capacitor. In other embodiments, a reference capacitor may not be required, and may be replaced with circuitry that measures current flow out of said current mirror circuit, and integrates the current over time. Further, the present invention teaches that it may be necessary to perform both said first measurement and said second measurement before declaring a result, to accommodate the case where no or negligible acceleration was experienced.

In addition, the present invention teaches that parasitic capacitance cancellation (PCC) apparatus and methods as disclosed in U.S. Pat. No. 8,395,395 and in U.S. Pat. No. 8,659,306 by Bruwer et al may be used by the present invention to compensate for unwanted capacitances and changes in capacitance. The present invention further teaches specifically that it may be possible to compensate for parasitic capacitances between the above first terminal of the first capacitance and ground, and between the above second terminal of the second capacitance and ground by utilizing sufficiently large transistors to drive said terminals. In other words, according to the present invention, by correctly sizing the transistors used to drive said terminals, it may be possible to ensure that the amount of charge stored in said first capacitance and said second capacitance is practically independent of the parasitic capacitances between said terminals and ground.

To compensate for the parasitic capacitance between the second terminal of said first capacitance and ground, and between the first terminal of said second capacitance and ground, the present invention teaches that a sample-and-hold circuit may be used to ensure that the voltage on the common node (shared by said second terminal of the first capacitance and said first terminal of the second capacitance) stays constant during the charge phase of the charge transfer cycle, for example at the voltage value of the common node at the end of a transfer phase of a previous charge transfer cycle. For example a sample-and-hold op-amp circuit may be used in conjunction with a plurality of switches to charge a sample capacitor to a voltage present on said common node during one time period, and to drive said common node to the same voltage, using the voltage on the sample capacitor as input to the op-amp, during another period.

As noted during the background of the present disclosure, differential capacitive accelerometer structures typically exhibit a difference of around 100 fF between said first and second capacitances due to manufacturing tolerances, while the change in capacitance due to acceleration which has to be measured may be on the order of a few aF. (These values should not be construed as a limit to the present invention, as they are merely provided to aid clarity of disclosure.) The difference between said first and second capacitances typically cause a large offset in the signal being processed to determine acceleration. According to the present invention, such an offset may be removed or cancelled out by using a microprocessor algorithm to control a highly accurate, digitally variable capacitor, wherein said variable capacitor may be used to extract or change the amount of charge from a reference capacitor during certain periods of a charge transfer measurement cycle. Further, the variable capacitor may also be used with a current mirror structure or structures to facilitate said charge extraction.

It should also be noted that although reference was made during the preceding to accelerometer applications and the use of comb-like capacitive structures, the present invention need not be limited to these, and may be embodied in any number of alternatives which require the measurement of the difference in charge stored within a plurality of capacitances, and wherein said measurement may employ the apparatus and methods as presently disclosed.

During the preceding, embodiments which utilize a first and second mutual capacitance differential pair to measure acceleration, as an exemplary application, have been described. Typically, such embodiments may be used to measure acceleration along a single axis, for example along an X-axis in a Cartesian coordinate system. Naturally, the present invention is not limited to single axis acceleration measurement embodiments, with the teachings as disclosed which may be used to measure or determine acceleration, or another parameter, along any number of axes or directions, for example along orthogonal axes such as X, Y and Z axes in a Cartesian coordinate system. In such exemplary embodiments, a distinct structure which comprises differential first and second capacitors, similar to that described earlier during the present disclosure, may be utilized for each axis or direction, as an example. Alternatively, a single structure which comprises multiple differential capacitor pairs may be utilized to measure acceleration, or another parameter, along a plurality of axes or directions, according to the present invention.

The present invention also teaches that methods and means as disclosed may be used to measure acceleration, or another parameter, along a plurality of axes or directions, for example along X, Y and Z axes, in a sequential or concurrent manner. That is, acceleration, or another parameter, may be measured, for example, along an X-axis first, then along a Y-axis and then along a Z-axis, or the acceleration may be measured simultaneously along all three axes. In the case of a sequential measurement, the present invention is not limited in terms of the pattern or sequence of measurement.

BRIEF DESCRIPTION OF THE DRAWINGS

The invention is further described by way of examples with reference to the accompanying drawings in which:

FIG. 1 shows a typical prior art measurement system used to monitor acceleration with a serially connected capacitive structure.

FIG. 2 shows an exemplary embodiment of the present invention for monitoring acceleration with effectively parallel capacitive structures and using a switching structure, charge transfer measurements and current mirror circuitry.

FIG. 3 shows qualitative transmitter electrode signals for a first and second measurement made with an exemplary embodiment of the present invention.

FIG. 4 shows a table summarizing typical results for measurements made with exemplary embodiments of the present invention.

DETAILED DESCRIPTION OF EMBODIMENTS

Figure 5:
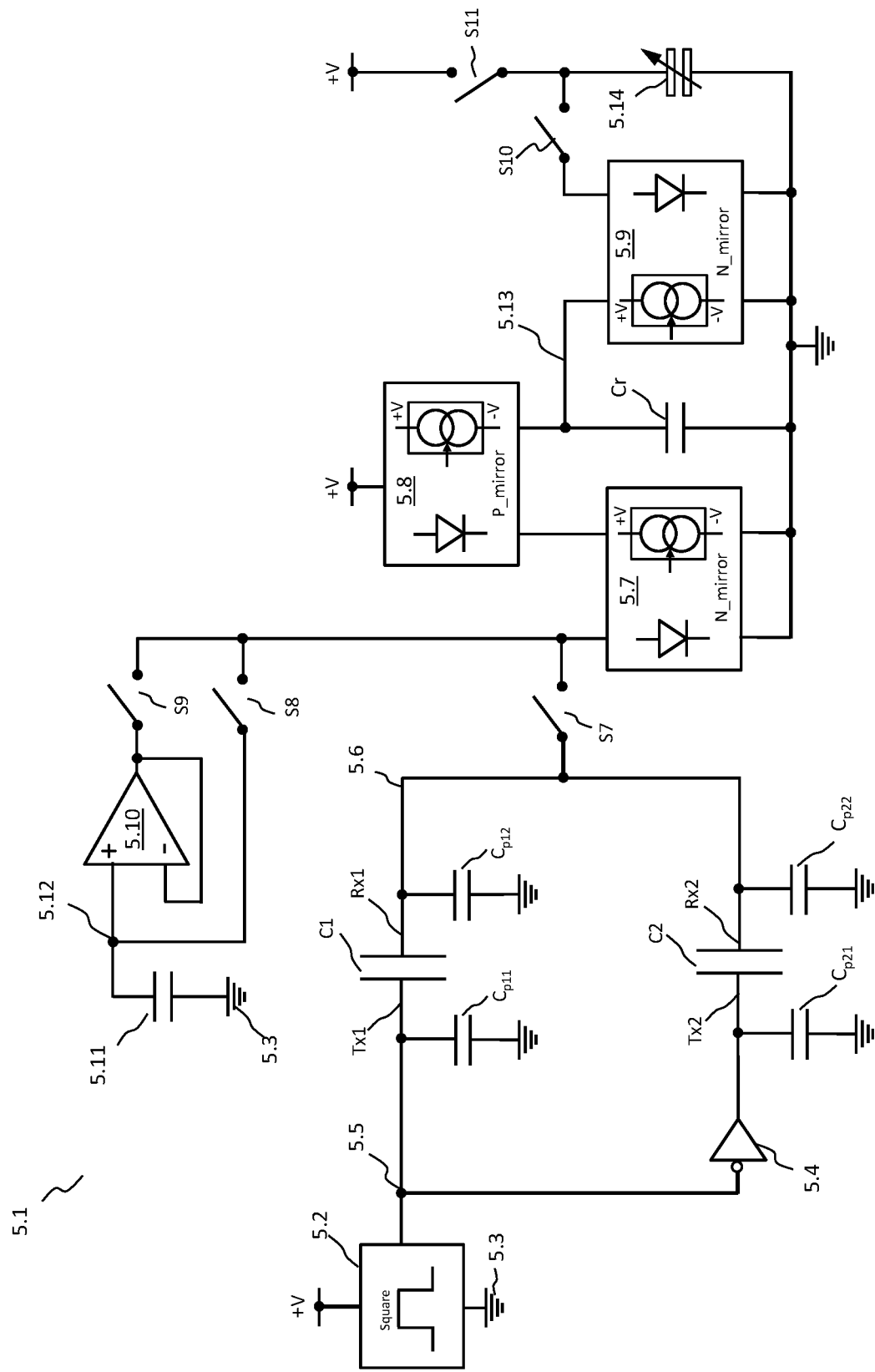
FIG. 5 shows an exemplary embodiment of the present invention with compensation for common junction parasitic capacitance as well as offset compensation.

The following description of the appended drawings are presented merely to clarify the spirit and scope of the present invention, and not to limit it. It should be understood that these are merely exemplary embodiments, and a large number of alternative or equivalent embodiments may exist which still fall within the scope of the claims for the present invention.

FIG. 2 presents an exemplary embodiment of the present invention. Block 2.1 represents a comb-like structure, as is known in the art of MEMS based accelerometers, wherein two primary capacitances C1 and C2 are realized, connected in a back-to-back configuration. In a typical application, each of these capacitances may have parasitic, or unintended, capacitances, represented by $C_{p11}$, $C_{p12}$, $C_{p21}$ and $C_{p22}$ respectively. In the embodiment shown, capacitances C1 and C2 may be measured as mutual or projected capacitances, with C1 having a transmitter electrode Tx1 and receiver electrode Rx1, and C2 having a transmitter electrode Tx2 and receiver electrode Rx2, respectively. Said parasitic capacitances are typically formed between a transmitter or receiver electrode and ground, as shown. For the exemplary embodiment presented, Rx1 and Rx2 are connected together and represent the common electrode of said comb-like structure used for measuring acceleration.

The transmitter electrode Tx1 of C1 may be connected via a controllable switch S1 to a supply voltage 2.2, or it may be connected via a controllable switch S2 to ground 2.3, as shown. In a similar manner, the transmitter electrode Tx2 of C2 may be connected to said supply voltage via a controllable switch S3, or it may be connected to ground via a controllable switch S4. A controllable switch S5 may be used to connect the common point formed by Rx1 and Rx2 to the input 2.5 of a current mirror 2.4. In a preferred embodiment, S5 is continually closed, although it should not be limited to this state. The latter forms parts of a current mirror circuit, as an example, similar to what is taught in U.S. Pat. No. 8,659,306, and current flowing at output terminal 2.6 may be dependent on the current at input terminal 2.5 and a predetermined mirror ratio. Current flowing into input 2.5 may result from charge being transferred from either C1 or C2, wherein said charge transfer may occur due to the controlled switching of switches S1 to S4, as will be elaborated on. Further, in the example shown, output 2.6 of current mirror 2.4 is connected to input 2.8 of current mirror 2.7, which may result in a scaled current flowing via output 2.9 of mirror 2.7. Said scaled current, which may be larger or smaller than the current that flows into input 2.5 of mirror 2.4, may be applied to a reference capacitor Cr1 via a controllable switch S6, wherein the number of charge transfers to fill Cr1 to a predetermined level, or which occurs within a predetermined period, may be monitored and used as measurement metric, for example as indication of the amount capacitance, as is known in the art.

The present invention is further embodied in the qualitative transmitter electrode waveforms of FIG. 3, which presents an exemplary manner to control the circuitry of FIG. 2 for a differential, CT based measurement of the change in C1 and C2, wherein said change may be due to acceleration experienced by the measurement system. According to the present invention, a first measurement may be made with transmitter waveforms as illustrated at 3.1. Axis 3.2 represents amplitude, with level 3.5 indicating when the supply voltage is connected to a particular transmitter electrode, and level 3.6 indicating when the particular transmitter electrode is connected to ground. Axes 3.3 and 3.4 represent time. During a first charge phase φ11 of said first measurement, transmitter electrode tx1 may be connected to ground via switch S2 (FIG. 2), and transmitter electrode tx2 may be connected to the supply voltage via switch S3 (FIG. 2). This may be followed by a second transfer_phase φ12, during which transmitter electrode tx1 may be connected to the supply voltage via switch S1 (FIG. 2), and transmitter electrode tx2 may be connected to ground via switch S4 (FIG. 2). As is shown, said first charge phase φ11 and said second transfer phase φ12 may subsequently be alternately repeated during the remainder of said first measurement until the reference capacitor Cr1 (FIG. 2) reaches a predetermined threshold, or for a predetermined period. The number of phase repetitions in FIG. 3 is only provided as an example, and should not be seen as limiting. According to the present invention, said first measurement as described and depicted in FIG. 3 may be seen as being equivalent to subtracting the charge stored in C2 (FIG. 2) from that stored in C1 (FIG. 2), and if the difference is positive, it or a derivative thereof may be transferred to said reference capacitor. If said difference is negative, no charge may be transferred to said reference capacitor due to blocking by the input diode of the current mirror circuit 2.4 (FIG. 2).

Further, according to the present invention, a second measurement may need to be made before declaring a result, as depicted in exemplary manner in FIG. 3 at 3.7. During a first charge phase φ21 of the second measurement, transmitter electrode tx1 may be connected to the supply voltage via switch S1 (FIG. 2), and transmitter electrode tx2 may be connected to ground via switch S4 (FIG. 2). This may be followed by a second transfer_phase φ22 of the second measurement during which transmitter electrode tx1 may be connected to ground via switch S2 (FIG. 2) and transmitter electrode tx2 may be connected to the supply voltage via switch S3 (FIG. 2). Once again, the first charge phase ϕ21 and the second transfer phase ϕ22 of said second measurement may subsequently be alternately repeated until the reference capacitor Cr1 (FIG. 2) reaches a predetermined threshold, or for a predetermined period. The number of phase repetitions illustrated is only provided as an example, and should not be seen as limiting. According to the present invention, said second measurement as described and depicted in FIG. 3 may be seen as being equivalent to subtracting the charge stored in C1 (FIG. 2) from that stored in C2 (FIG. 2), and if the difference is positive, it or a derivative thereof may be transferred to said reference capacitor. If said difference is negative, no charge may be transferred to said reference capacitor due to blocking by the input diode of the current mirror circuit 2.4 (FIG. 2). In the preceding and elsewhere, one repetition of phase ϕ11 and phase ϕ12 may form a charge transfer cycle. Correspondingly, one repetition of phase ϕ21 and phase ϕ22 may form a charge transfer cycle.

In the above, the number of counts (Ct) may indicate how many charge transfers are required to charge the reference capacitor Cr to a trip voltage Vt, as is known in the art. This may be written as:

$Qr=Cr*Vt$; and $Ct=Qr/\Delta Q$

Where $\Delta Q$ is the delta of charge transferred during a particular charge transfer.

If C2<C1 and ΔC=(C2−C1) is measured, or if C2>C1 and ΔC=(C1−C2) is measured, then ΔQ should be zero, and Ct should be infinitely large. Normally the system would have a timeout after a certain period, in which case Ct should be the maximum number of counts (Ctmax) the counter can handle when time out is reached.

If C2>C1 and ΔC=(C2−C1) is measured, or if C2<C1 and ΔC=(C1−C2), then a charge ΔQ will be transferred during each cycle, the number of counts or transfers, Ct will be a finite value<Ctmax.

In FIG. 4, an exemplary table is presented which summarises the above, with three cases or scenarios considered. In Case 1, a first capacitance C1 of an embodiment of the present invention is larger than a second capacitance C2, for example due to acceleration experienced by said embodiment. According to the invention, a first measurement and a second measurement may need to be made with apparatus and methods as described earlier. During a first measurement, which may be deemed equivalent to subtracting charge stored in C2 from that in C1, a delta of charge ΔQ1 may be transferred during each charge transfer cycle or phase, wherein said delta may be proportional to the amount by which C1 is larger than C2 during Case 1. Therefore, the charge transfer counts Ct1 at the end of said first measurement should be proportional to the amount by which C1 is larger than C2. During a second measurement for Case 1, which may be deemed equivalent to subtracting charge stored in C1 from that stored in C2, no charge should be transferred, seeing that C1 is larger than C2 and said subtraction should result in a deficiency of charge which may typically not be transferred out of the current mirror circuit, as described earlier. Therefore, the counts Cr1 for the second measurement of Case 1 should be equal to Ctmax, as a timeout would typically occur. For Case 1, after completion of the first and second measurements, associated processing circuitry may determine that C1 is larger than C2, seeing that only the first measurement resulted in charge transfer, and said processing circuitry may also use the number of charge transfers Cr1 performed during the first measurement to determine the amount by which C1 is larger than C2. For example, in an acceleration measurement application, this may be indicative of the amount of acceleration experienced. It should further be noted that for Case 1, the result achieved after the first measurement may be sufficient for some applications, without a requirement for a second measurement as described.

In Case 2, a capacitance C2 in an embodiment of the invention is larger than a capacitance C1, for example due to acceleration experienced by the embodiment. During a first measurement, which may be deemed equivalent to subtracting charge stored in C2 from that stored in C1, no charge should be transferred, seeing that C2 is larger than C1 and said subtraction should result in a deficiency of charge which may typically not be transferred out of the current mirror circuit, as described earlier. Therefore, the counts Ct2 for the first measurement of Case 2 should be equal to Ctmax, as a timeout would typically occur. During a second measurement for Case 2, which may be deemed equivalent to subtracting charge stored in C1 from that stored in C2, a delta of charge ΔQ2 may be transferred during each charge transfer cycle or phase, wherein said delta is proportional to the amount by which C2 is larger than C1 during Case 2. Therefore, the charge transfer counts Ct2 at the end of said second measurement should be proportional to the amount by which C1 is smaller than C2. After the completion of the first and second measurements for Case 2, associated processing circuitry may determine that C2 is larger than C1, seeing that only the second measurement resulted in charge transfer, and said processing circuitry may also use the number of charge transfers Ct2 performed during the second measurement to determine the amount by which C2 is larger than C1, similar to before.

In Case 3, capacitances C1 and C2 are equal. For example, in an acceleration measurement application, this may occur when no acceleration is experienced, and the comb-like structure mentioned earlier maintains the spacing between the various sets of electrodes or conductive fingers. As shown in FIG. 4, no charge should be transferred during either the first or second measurement. An associated processing circuit may deduce from the fact that the charge transfer counts Ct3 equalled Ctmax for both the first and second measurement of Case 3 that C1 is equal to C2.

FIG. 5 presents another exemplary embodiment of the present invention at 5.1. The circuit depicted in FIG. 5 is similar to the circuit of FIG. 2, with like reference designators referring to like members. A square wave generator 5.2 is connected between a supply rail +V and ground 5.3, and outputs a square wave at node 5.5. Generator 5.2 is not limited, and may utilize any relevant circuitry, including that depicted in FIG. 2. Capacitances C1 and C2 may represent a capacitive comb structure, as discussed earlier, with terminals Tx1 and Tx2 respectively the driven terminals of C1 and C2, and terminals Rx1 and Rx2 forming a common terminal 5.6. An inverting element 5.4 may be used to ensure that Tx2 is driven in anti-phase to Tx1, e.g. when Tx1 is driven at supply rail +V, Tx2 is connected to ground potential and vice versa. As discussed earlier, a number of parasitic capacitances exist in practical comb, and other, capacitive structures, represented by $C_{p11}$, $C_{p21}$, $C_{p12}$ and $C_{p22}$. To ensure that parasitic capacitances $C_{p11}$ and $C_{p21}$ do not adversely influence the capacitive measurement process, the present invention teaches that sufficiently large transistors (e.g. in square wave generator 5.2 and in inverter 5.4) need to be used to drive nodes or terminals Tx1 and Tx2.

Parasitic capacitances $C_{p11}$ and $C_{p21}$ should not impede the measurement process if said transistors allow sufficient current flow to adequately charge C1 and $C_{p11}$ or C2 and $C_{p21}$.

Further, according to the present invention, it may be possible to compensate for the effect of parasitic capacitances $C_{p12}$ and $C_{p22}$ by using a sample and hold op-amp 5.10 along with controlled switches S7, S8 and S9 to ensure that the voltage on node 5.6 is exactly the same at the beginning of a charge transfer cycle as the voltage on node 5.6 at the end of said cycle. Switches S7 and S8 may be used to charge sample capacitor 5.11 during a transfer phase such that the voltage at node 5.12 is equal to the voltage at 5.6, preferably to the voltage at 5.6 at the end of the transfer phase. Conversely, switches S7 and S9 are used during the charge phase to drive the voltage at node 5.6 with op-amp 5.10 to equal the voltage at node 5.12. In a preferred embodiment, switch S7 is continually closed, although this need not necessarily be so. In essence, use of the sample-and-hold circuit constituted by op-amp 5.10, capacitor 5.11 and controlled switches S8 and S9 should ensure that practically no netto charge stored in parasitic capacitances $C_{p12}$ and $C_{p22}$, or a derivative thereof, is transferred to the reference capacitor, thereby cancelling the effect of said parasitic capacitances.

The measurement process for the circuit depicted in FIG. 5 is similar to that described above for FIG. 2, with two charge transfer measurements made, wherein the one measurement is characterised by terminal Tx1 first being driven high, then Tx2, followed by a number of charge transfer cycle repetitions, and wherein the other measurement is characterised by terminal Tx2 first being driven high, then Tx1, followed by a number of charge transfer cycle repetitions. First and second current mirror structures 5.7 and 5.8 are used, similar to structures 2.4 and 2.7 in FIG. 2, to transfer and scale charge from node 5.6 to a reference capacitor Cr during said two measurements. Determination of acceleration with the circuit of FIG. 5 may be done in a manner similar to that described above with reference to FIGS. 2, 3 and 4, and will not be elaborated on further for brevity's sake.

FIG. 5 also includes a third current mirror structure 5.9, which may be used with switches S10 and S11 along with digitally controlled variable capacitor 5.14 to compensate for any offset due to a difference between C1 and C2, for example when no acceleration is experienced by the circuit. A compensation algorithm, which may execute on a microprocessor, microcontroller, computer or another computing platform, may be used to adjust or select the value of variable capacitor 5.14. Switch S11 may be used to selectively charge variable capacitor 5.14 to the supply rail voltage +V, or to another voltage. Switch S10 may be used to selectively allow a current due to the discharge of variable capacitor 5.14, or another current, to flow into the input of current mirror 5.9. This should result in a scaled current flowing through the output of mirror 5.9 at node 5.13, changing the amount of current out of mirror 5.8, thereby also changing the amount of current which flows through reference capacitor Cr, thus changing the amount of charge stored in Cr. In such a manner it may be possible, according to the present invention, to accurately compensate for a large range of offsets due to differences in C1 and C2, or other mismatches, using mirror 5.9 as described, also in conjunction with, or without, the scaling ratios provided by mirror structures 5.7 and 5.8. The ability to easily and accurately compensate for a large range of offset provides a significant advantage over prior art capacitive MEMS accelerometer solutions. Not only does it ease manufacturing constraints required to ensure that C1 and C2 are initially as closely matched as possible, but it also allows MEMS structure IC's to be used with signal processing ASIC's not necessarily designed specifically for the specific MEMS structure IC, and vice versa, to ensure the lowest offset possible.

The disclosure presented used measurement of acceleration as an exemplary embodiment of the present invention. It will be understood that this should not be construed as limiting, and that use of the disclosed apparatus and methods in any application which needs to measure a differential change between a plurality of capacitances may still fall within the claims of the present invention.

The invention claimed is:

1. A method for measuring a differential change between first and second mutual capacitances of a MEMS circuit, wherein receiver electrodes of said first and second mutual capacitances are joined to form a common electrode, wherein charge transfer measurements are used to transfer charge to a reference capacitor and a plurality of current mirror structures are used to scale and control the amount of charge being transferred to said reference capacitor, and wherein a digitally controlled variable capacitor is used to change the amount of charge stored in said reference capacitor; with said method comprising the steps of:

performing first and second charge transfer measurements, each comprising a number of charge transfer cycles used to transfer charge from said common electrode to the reference capacitor, said first measurement characterised by driving a transmit electrode of said first capacitance high first, said second measurement characterised by driving a transmit electrode of said second capacitance high first;

compensating for parasitic capacitances in said MEMS circuit through the use of a sample-and-hold circuit selectively connected to said common electrode to maintain its voltage during a charge phase of a charge transfer cycle.

2. The method of claim 1, wherein said variable capacitor and mirror structures are used to compensate for an offset in the measured differential capacitance change signal.

3. The method of claim 1, wherein said MEMS circuit forms part of an integrated accelerometer.

4. The method of claim 3, wherein said integrated accelerometer comprises circuitry for said charge transfer measurements, also comprising at least one of said current mirror structures, said variable capacitor, said reference capacitor and said sample-and-hold circuit.

5. The method of claim 1, wherein said first and second charge transfer measurements respectively provides first and second charge transfer count values, and wherein any one of the following is used to determine said differential capacitance change;

the first charge transfer count value;

the second charge transfer count value;

both the first and the second charge transfer count values.

6. The method of claim 5, wherein said first and second measurements are further characterised by repetitively driving the transmitter electrodes of the first and second capacitances out of phase from each other with either a supply voltage or with a ground potential; wherein said common terminal is connected to a remainder of said charge transfer measurement circuit for the transfer of a difference between charge stored within said first and second capacitances to the reference capacitor.

7. The method of claim 1, wherein driving circuitry connected to said transmit electrodes of the first and second mutual capacitances is selected to compensate for parasitic capacitances between said transmit electrodes and ground.

8. The method of claim 7, wherein said selection entails the correct sizing of transistors used to drive said transmit electrodes.

9. The method of claim 1, wherein three pairs of said first and second mutual capacitances are used to sequentially measure acceleration along three orthogonal axes.

10. The method of claim 1, wherein three pairs of said first and second mutual capacitances are used to concurrently measure acceleration along three orthogonal axes.

11. An integrated circuit for measuring a differential change between first and second mutual capacitances of a MEMS circuit, wherein receiver electrodes of said first and second mutual capacitances are joined to form a common electrode, said integrated circuit performing charge transfer measurements to transfer charge to a reference capacitor, with a plurality of current mirror structures used to scale and control the amount of charge being transferred to said reference capacitor, wherein a digitally controlled variable capacitor is used to change the amount of charge stored in said reference capacitor, with said integrated circuit performing first and second charge transfer measurements, each comprising a number of charge transfer cycles used to transfer charge from the common electrode to the reference capacitor, said first measurement characterised by driving a transmit electrode of said first capacitance high first, said second measurement characterised by driving a transmit electrode of said second capacitance high first; and wherein the integrated circuit compensates for parasitic capacitances in said MEMS circuit through the use of a sample-and-hold circuit selectively connected to said common electrode to maintain its voltage during a charge phase of a charge transfer cycle.

12. The integrated circuit of claim 11 wherein said variable capacitor and mirror structures are used to compensate for an offset in the measured differential capacitance change signal.

13. The integrated circuit of claim 11, wherein said MEMS circuit forms part of the integrated circuit used as an integrated accelerometer.

14. The integrated circuit of claim 13, wherein said integrated accelerometer comprises circuitry for said charge transfer measurement, also comprising at least one of said current mirror structures, said reference capacitor and said sample-and-hold circuit.

15. The integrated circuit of claim 11, wherein said first and second charge transfer measurements respectively provides first and second charge transfer count values, and wherein any one of the following is used to determine said differential capacitance change;
    the first charge transfer count value;
    the second charge transfer count value;
    both the first and the second charge transfer count values.

16. The integrated circuit of claim 15, wherein said first and second measurements are further characterised by repetitively driving the transmitter electrodes of the first and second capacitances out of phase from each other with either a supply voltage or with a ground potential; wherein said common terminal is connected to the remainder of said charge transfer measurement circuit for the transfer of a difference between charge stored within said first and second capacitances to the reference capacitor.

17. The integrated circuit of claim 11, wherein driving circuitry connected to said transmit electrodes of the first and second mutual capacitances is selected to compensate for parasitic capacitances between said transmit electrodes and ground.

18. The integrated circuit of claim 17, wherein said selection entails the correct sizing of transistors used to drive said transmit electrodes.

19. The integrated circuit of claim 11, wherein said reference capacitor is replaced by a circuit which measures current out of one of said plurality of current mirror structures, and wherein said current measurement is integrated over time to determine the amount of charge transferred.

20. The integrated circuit of claim 11, wherein said first and second mutual capacitances are used to measure acceleration along a first axis, and wherein two additional pairs of mutual capacitances form part of said MEMS circuit and are used to measure acceleration along two additional axes, wherein said additional axes are orthogonal to each other and to said first axis, and wherein circuitry within said integrated circuit performs said acceleration measurements according to one of:
    i. a sequential manner;
    ii. a concurrent manner.

* * * * *